United States Patent
Lai et al.

(10) Patent No.: US 10,938,379 B2
(45) Date of Patent: Mar. 2, 2021

(54) AUTOMATIC FREQUENCY MODULATION CIRCUIT AND AUTOMATIC FREQUENCY MODULATION METHOD APPLIED TO PULSE-WIDTH MODULATION SYSTEM

(71) Applicant: Raydium Semiconductor Corporation, Hsinchu (TW)

(72) Inventors: Ji-Ting Lai, Taipei (TW); Shen-Xiang Lin, Taipei (TW); Chih-Jen Hung, Taipei (TW)

(73) Assignee: Raydium Semiconductor Corporation, Hsinchu County (TW)

( * ) Notice: Subject to any disclaimer, the term of this patent is extended or adjusted under 35 U.S.C. 154(b) by 0 days.

(21) Appl. No.: 16/903,433

(22) Filed: Jun. 17, 2020

(65) Prior Publication Data

US 2020/0395920 A1 Dec. 17, 2020

Related U.S. Application Data

(60) Provisional application No. 62/862,193, filed on Jun. 17, 2019.

(51) Int. Cl.
| | |
|---|---|
| *H03K 7/08* | (2006.01) |
| *H03K 3/017* | (2006.01) |
| *H03K 5/00* | (2006.01) |
| *H03L 7/06* | (2006.01) |
| *H03K 7/06* | (2006.01) |

(52) U.S. Cl.
CPC ......... *H03K 3/017* (2013.01); *H03K 5/00006* (2013.01); *H03K 7/06* (2013.01); *H03K 7/08* (2013.01); *H03L 7/06* (2013.01)

(58) Field of Classification Search
CPC ............ H03K 3/017; H03K 7/06; H03K 7/08; H03K 5/00006; H03L 7/00; H03L 7/06
See application file for complete search history.

(56) References Cited

U.S. PATENT DOCUMENTS 9,831,765 B2 * 11/2017 Liu ........................... H03K 7/06
10,199,930 B2 * 2/2019 Liu ........................... H03K 7/06

* cited by examiner

*Primary Examiner* — Long Nguyen

(57) ABSTRACT

An automatic frequency modulation circuit and an automatic frequency modulation method using efficiency statistics as a reference for frequency modulation applied to a pulse-width modulation (PWM) system are disclosed. The automatic frequency modulation circuit includes an oscillator unit, an on-time generating unit, a frequency adjusting unit and a frequency selecting unit. The oscillator unit receives a reference current and generate a clock signal. The on-time generating unit, coupled to the oscillator unit, receives a reference voltage and a first voltage of the oscillator unit and generates an on-time signal. The frequency adjusting unit, coupled to the on-time generating unit, receives the on-time signal and a PWM signal and generates a frequency adjusting signal. The frequency selecting unit is coupled to the frequency adjusting unit and automatically adjusts an original frequency according to the frequency adjusting signal to generate an adjusted frequency.

14 Claims, 6 Drawing Sheets

AUTOMATIC FREQUENCY MODULATION CIRCUIT AND AUTOMATIC FREQUENCY MODULATION METHOD APPLIED TO PULSE-WIDTH MODULATION SYSTEM

BACKGROUND OF THE INVENTION

1. Field of the Invention

The invention relates to frequency modulation; in particular, to an automatic frequency modulation circuit and an automatic frequency modulation method applied to a pulse-width modulation system.

2. Description of the Prior Art

Please refer to FIG. 1 and FIG. 2. FIG. 1 and FIG. 2 illustrate waveform diagrams of a pulse width modulation (PWM) signal and a pulse-frequency modulation (PFM) signal in the prior art respectively.

Generally speaking, the PWM technology performs better in general pumping current efficiency, but its control loop is more complicated, and its efficiency at light-load is not as good as the PFM technology; as for the PFM technology, although its circuit is simpler and consumes less power, the limitations of its architecture result in poor performance under heavy-load.

Therefore, the current common operating method is to use a combination of the PWM loop and the PFM loop to determine whether the load is heavy or light by detecting the load current. If the load is heavy, the PWM loop will be selected to operate; if the load is light, and under light load, the PFM loop will be selected to operate to maximize the efficiency.

As to the switching between the PWM mode and the PFM mode, the conventionally common practice is to detect an output terminal voltage of an error amplifier in the PWM loop and use the output terminal voltage as a sampling signal of the load current. When the output terminal voltage is lower than a default reference voltage, the PWM mode will be switched to the PFM mode.

However, in practical applications, the above-mentioned conventional detection method may cause misjudgment due to some special circumstances. For example, when it is applied to a LED driver, if the dimming frequency is too low, the output voltage of the error amplifier will drop during the period of stopping the mode switching, resulting in a false switching between the PWM mode and the PFM mode, which needs to be improved.

SUMMARY OF THE INVENTION

In view of this, the invention discloses an automatic frequency modulation circuit and an automatic frequency modulation method applied to a PWM system to effectively solve the aforementioned problems encountered in the prior arts.

An embodiment of the invention is an automatic frequency modulation circuit. In this embodiment, the automatic frequency modulation circuit is applied to a PWM system and uses efficiency statistics as a reference for frequency modulation. The automatic frequency modulation circuit includes an oscillator unit, an on-time generating unit, a frequency adjusting unit and a frequency selecting unit. The oscillator unit is configured to receive a reference current and generate a clock signal. The on-time generating unit is coupled to the oscillator unit and configured to receive a reference voltage and a first voltage of the oscillator unit and generate an on-time signal. The frequency adjusting unit is coupled to the on-time generating unit and configured to receive the on-time signal and a PWM signal and generate a frequency adjusting signal. The frequency selecting unit is coupled to the frequency adjusting unit and configured to automatically adjust an original frequency according to the frequency adjusting signal to generate an adjusted frequency.

In an embodiment, the automatic frequency modulation circuit further includes an integrated circuit bus (I2C) coupled to the frequency selecting unit and used for providing the original frequency to the frequency selecting unit.

In an embodiment, the automatic frequency modulation circuit further includes a reference current generating unit coupled between the frequency selecting unit and the oscillator unit and used for receiving the adjusted frequency outputted by the frequency selecting unit and generating the reference current to the oscillator unit.

In an embodiment, the automatic frequency modulation circuit further includes a reference voltage generating unit coupled between the frequency selecting unit and the on-time generating unit and used for receiving the adjusted frequency outputted by the frequency selecting unit and generating the reference voltage to the on-time generating unit.

In an embodiment, the on-time generating unit generates a second voltage according to the first voltage and then generates the on-time signal according to the second voltage and the reference voltage.

In an embodiment, the frequency adjusting unit generates the frequency adjusting signal according to a phase detecting result of the on-time signal and the PWM signal.

In an embodiment, the oscillator unit includes an oscillating current source and an oscillating capacitor coupled in series with each other, and the first voltage is a node voltage between the oscillating current source and the oscillating capacitor.

Another embodiment of the invention is an automatic frequency modulation method. In this embodiment, the automatic frequency modulation method is applied to the PWM system and uses efficiency statistics as a reference for frequency modulation. The automatic frequency modulation method includes following steps: (a) generating a clock signal according to a reference current; (b) generating an on-time signal according to the reference voltage and a first voltage, wherein the first voltage is related to an oscillator unit; (c) generating a frequency adjusting signal according to the on-time signal and the PWM signal; and (d) automatically adjust an original frequency according to the frequency adjusting signal to generate an adjusted frequency.

Compared to the prior arts, the invention discloses an automatic frequency modulation circuit and an automatic frequency modulation method applied to a PWM system using efficiency statistics as a reference for frequency modulation without switching between the PWM mode and the PFM mode according to the load status (heavy-load or light-load), but directly determine the new operating frequency of each operating point according to its efficiency statistical results, so it can effectively avoid the misjudgment due to some special circumstances (such as when the dimming frequency of the LED driver is too low) when determining whether the operating mode should be switched to achieve the effect of optimizing efficiency.

The advantage and spirit of the invention may be understood by the following detailed descriptions together with the appended drawings.

BRIEF DESCRIPTION OF THE APPENDED DRAWINGS

DETAILED DESCRIPTION OF THE INVENTION

Figure 1:
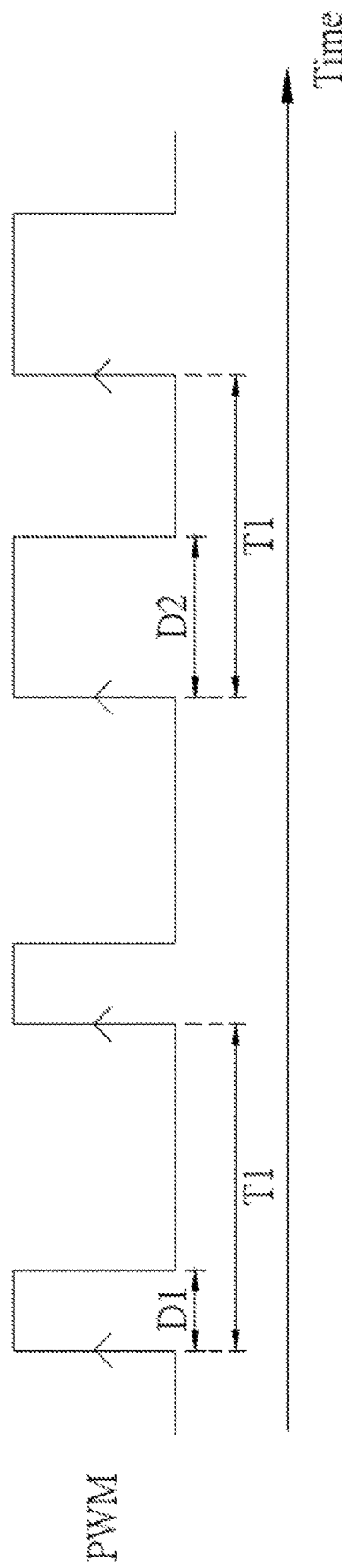
FIG. 1 and FIG. 2 are schematic diagrams of a PWM signal and a PFM signal in the prior art, respectively.
Figure 2:
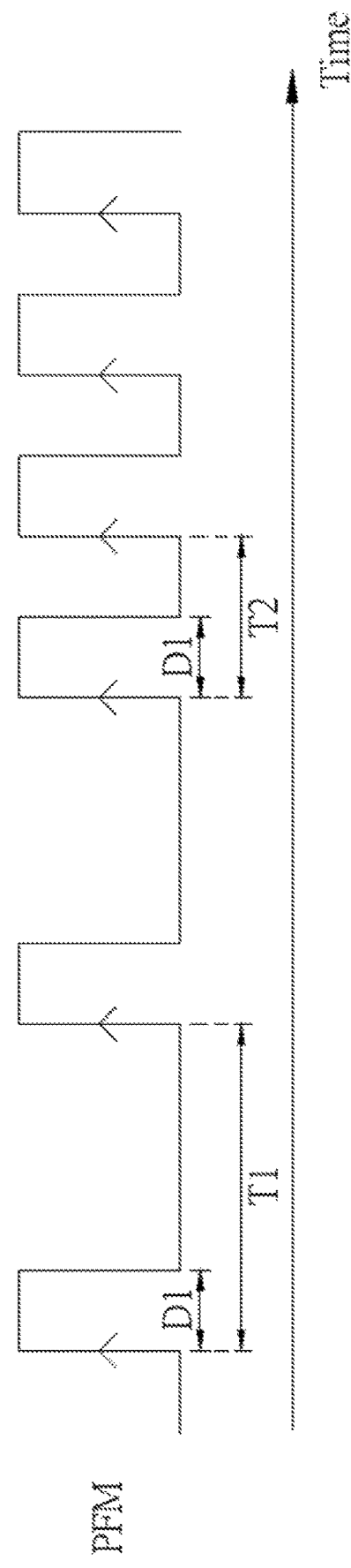

Reference will now be made in detail to the exemplary embodiments of the present invention, and examples of the exemplary embodiments will be described in the accompanying drawings. The same or similarly labeled elements/components are used in the drawings and embodiments to represent the same or similar parts.

An embodiment of the invention is an automatic frequency modulation circuit. In this embodiment, the automatic frequency modulation circuit of the invention can be applied to a display driving circuit (for example, a LED driver) and can use efficiency statistics as a reference for frequency modulation, but not limited to this. Since the automatic frequency modulation circuit of the invention is applied to a PWM system and uses efficiency statistics as a reference for frequency modulation instead of switching between the PWM mode and the PFM mode according to the load status (heavy-load or light-load); therefore, even if the dimming frequency of the LED driver is too low, it will not cause false switching, so as to achieve the effect of optimizing efficiency.

Figure 3:
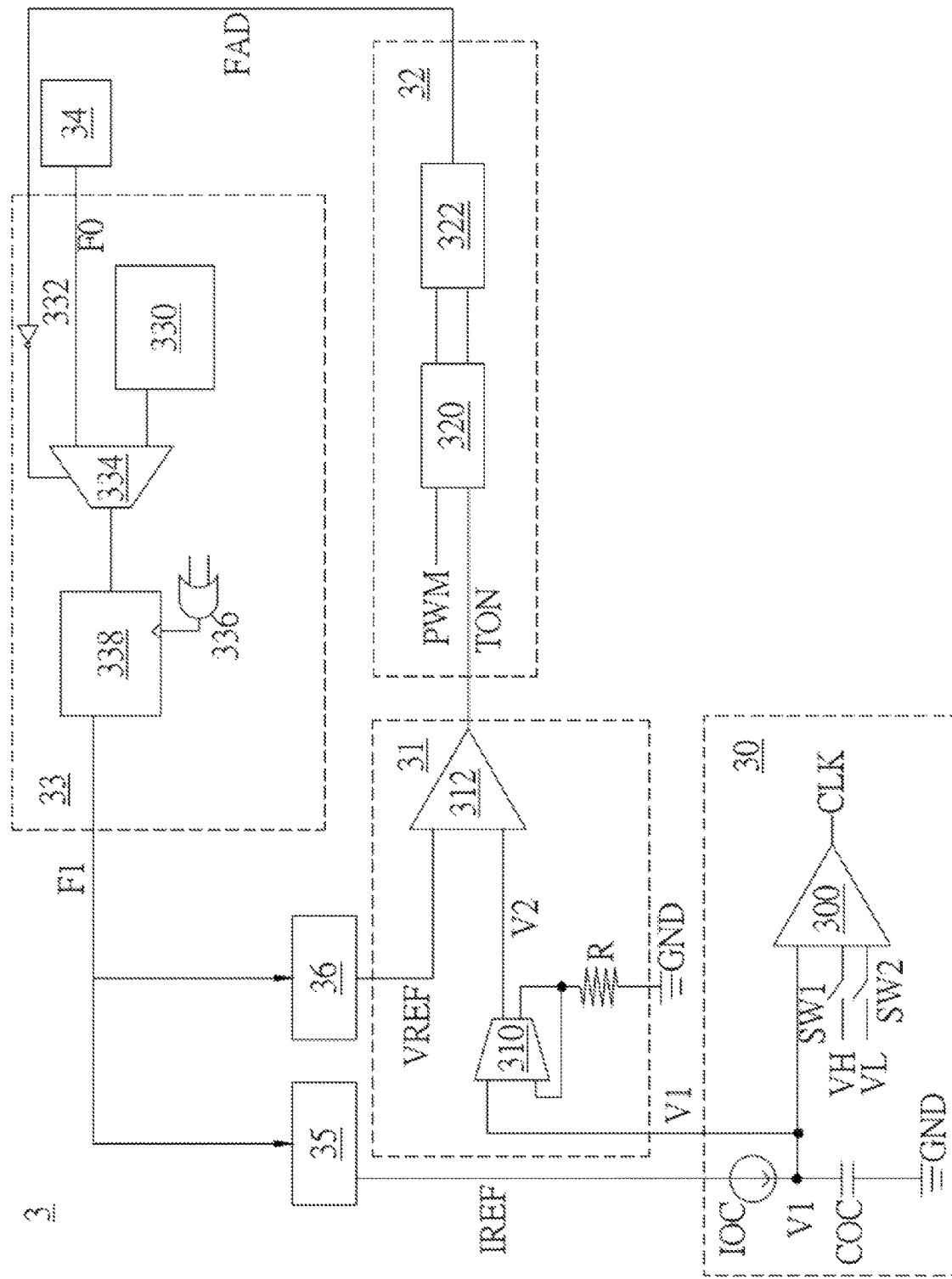
FIG. 3 is a functional block diagram of an automatic frequency modulation circuit in an embodiment of the invention.

Please refer to FIG. 3. FIG. 3 is a functional block diagram of the automatic frequency modulation circuit in this embodiment. As shown in FIG. 3, the automatic frequency modulation circuit 3 includes an oscillator unit 30, an on-time generating unit 31, a frequency adjusting unit 32, a frequency selecting unit 33, an integrated circuit bus 34, a reference current generating unit 35 and a reference voltage generating unit 36.

The on-time generating unit 31 is coupled to the oscillator unit 30. The frequency adjusting unit 32 is coupled to the on-time generating unit 31. The frequency selecting unit 33 is coupled to the frequency adjusting unit 32. The integrated circuit bus 34 is coupled to the frequency selecting unit 33. The reference current generating unit 35 is coupled between the frequency selecting unit 33 and the oscillator unit 30. The reference voltage generating unit 36 is coupled between the frequency selecting unit 33 and the on-time generating unit 31.

The oscillator unit 30 is used to receive a reference current IREF and generate a clock signal CLK. The on-time generating unit 31 receives a reference voltage VREF and a first voltage V1 of the oscillator unit 30 and generates the on-time signal TON. The frequency adjusting unit 32 is used to receive the on-time signal TON and the pulse width modulation signal PWM and generate a frequency adjusting signal FAD. The integrated circuit bus 34 is used to provide an original frequency F0 to the frequency selecting unit 33.

The frequency selecting unit 33 is used to automatically adjust the original frequency F0 according to the frequency adjusting signal FAD to generate an adjusted frequency F1. The reference current generating unit 35 is used to receive the adjusted frequency F1 outputted by the frequency selecting unit 33 and generate the reference current IREF to the oscillator unit 30. The reference voltage generating unit 36 is used to receive the adjusted frequency F1 outputted by the frequency selecting unit 33 and generate the reference voltage VREF to the on-time generating unit 31.

In practical applications, the on-time generating unit 31 generates a second voltage V2 according to the first voltage V1 and then generates the on-time signal TON according to the second voltage V2 and the reference voltage VREF. The frequency adjusting unit 32 generates the frequency adjusting signal FAD according to phase detecting results of the on-time signal TON and the pulse-width modulation signal PWM (for example, comparing the widths of the pulse-width modulation signal PWM and the on-time signal TON).

In this embodiment, the oscillator unit 30 can include an oscillating current source IOC and an oscillating capacitor COC coupled in series between the reference current generating unit 35 and the ground GND, and the first voltage V1 is a node voltage between the oscillating current source IOC and the oscillating capacitor COC. The oscillator unit 30 can further include a comparator 300, one input terminal of the comparator 300 receives the first voltage V1 and the other input terminal of the comparator 300 selectively receives the voltage VH or VL according to whether the first switch SW1 or the second switch SW2 is conducted, and the comparator 300 compares the first voltage V1 and the voltage VH or VL and outputs the clock signal CLK according to the comparison result.

In this embodiment, the on-time generating unit 31 can include a transconductance amplifier 310, a comparator 312 and a resistor R. One input terminal of the transconductance amplifier 310 receives the first voltage V1 between the oscillating current source IOC and the oscillating capacitor COC and the other input terminal is coupled to an output terminal and coupled to the ground GND through a resistor R. The other output terminal of the transconductance amplifier 310 outputs the second voltage V2 to one input terminal of the comparator 312. The other input terminal of the comparator 312 receives the reference voltage VREF from the reference voltage generating unit 36. The comparator 312 generates the on-time signal TON to the frequency adjusting unit 32 according to the second voltage V2 and the reference voltage VREF.

In this embodiment, the frequency adjusting unit 32 can include a phase detector 320 and a digital circuit 322. The phase detector 320 receives the current pulse-width modulation signal PWM and the on-time signal TON from the on-time generating unit 31 respectively, and compares the width of the duty cycle of the pulse-width modulation signal PWM and the width of the on-time signal TON in a phase detecting way to output the comparison result to the digital circuit 322. The digital circuit 322 generates the frequency adjusting signal FAD to the frequency selecting unit 33 according to the comparison result of the phase detector 320.

In fact, when the comparison result of the phase detector 320 is that the width of the duty cycle of the PWM signal PWM is smaller than the width of the on-time signal TON, the frequency reducing condition is met. Therefore, when the frequency selecting unit 33 receives the frequency adjusting signal FAD of the digital circuit 322, the frequency selecting unit 33 will start the frequency reducing operation. When the comparison result of the phase detector 320 is that the width of the duty cycle of the PWM signal is larger than the width of the on-time signal TON, the frequency reducing condition is not met. Therefore, when the frequency selecting unit 33 receives the frequency adjustment signal FAD of the digital circuit 322, the frequency selecting unit 33 will maintain the original operating frequency.

In this embodiment, the frequency selecting unit 33 can include a frequency reducing circuit 330, an inverter 332, a frequency multiplexer 334, an OR gate 336 and a flip-flop 338. The inverter 332 is coupled between the digital circuit 322 and the frequency multiplexer 334 to generate an inverted signal of the frequency adjusting signal FAD to the frequency multiplexer 334. The frequency multiplexer 334 is coupled to the integrated circuit bus 34, the frequency reducing circuit 330 and the inverter 332 respectively and used for selectively outputting the original frequency F0 provided by the integrated circuit bus 34 or the reduced frequency provided by the frequency reducing circuit 330 to the flip-flop 338 according to the inverted signal of the frequency adjusting signal FAD. The flip-flop 338 is coupled to the frequency reducing circuit 330, the frequency multiplexer 334 and the OR gate 336 respectively and used for outputting the adjusted frequency F1.

It should be noted that when the width of the duty cycle of the pulse width modulation signal PWM is larger than the width of the on-time signal TON, the adjusted frequency F1 outputted by the flip-flop 338 remains unchanged at the original frequency F0. When the width of the duty cycle of the pulse width modulation signal PWM is smaller than the width of the on-time signal TON, the adjusted frequency F1 outputted by the flip-flop 338 will be lower than the original frequency F0.

Figure 4:
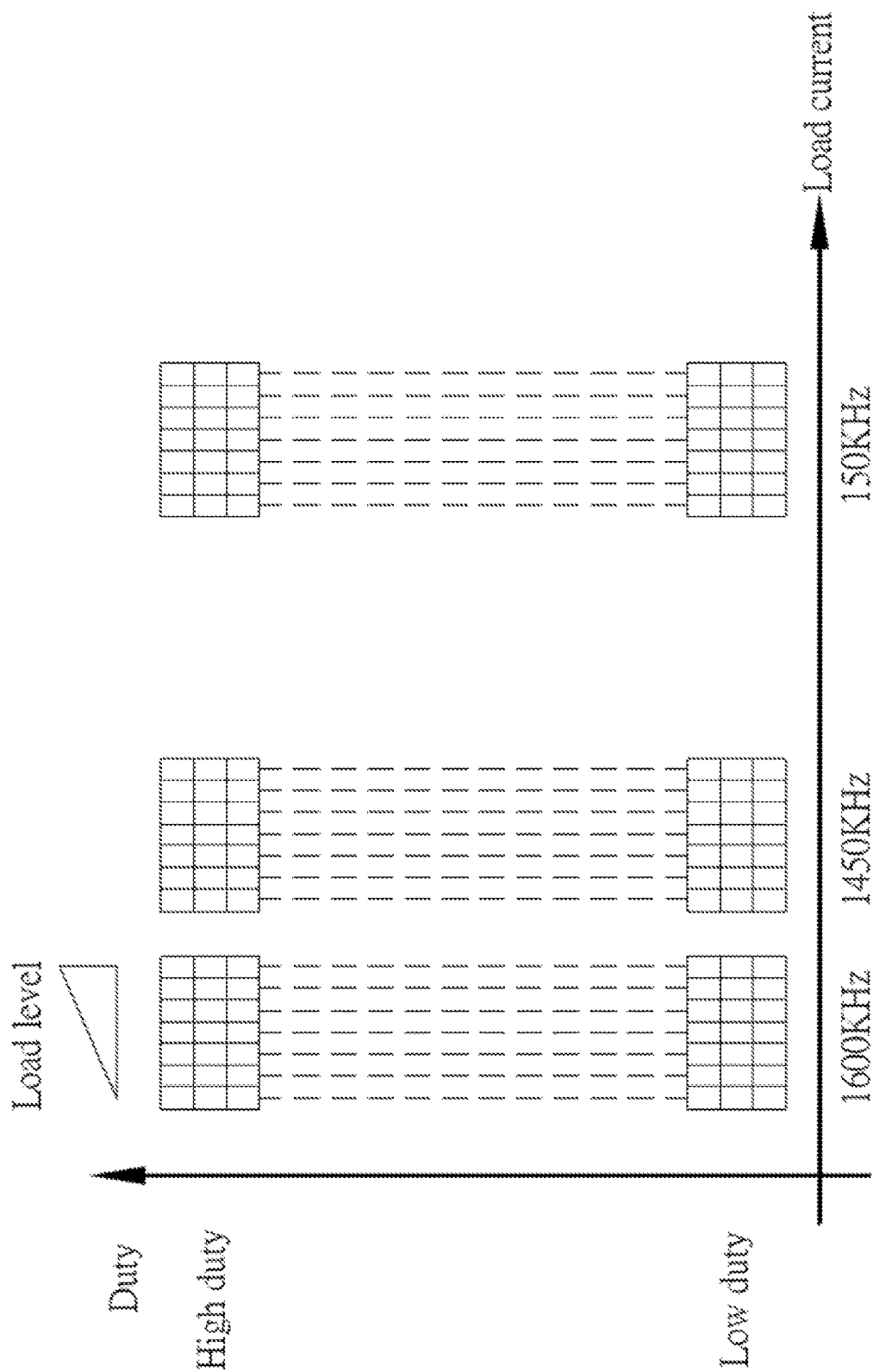
FIG. 4 is a schematic diagram showing the relationship between the load current and the duty cycle in different PWM operational frequency bands.

Please refer to FIG. 4. FIG. 4 is a schematic diagram showing the relationship between the load current and the duty cycle under different PWM operation frequency bands.

In this embodiment, since the parameters affecting the duty cycle of the system generally include the input voltage, output voltage, switching frequency and load current, etc., the load current in the application range can be regarded as the horizontal axis and put the values of 16 frequency bands respectively, and the vertical axis is the relationship between the input voltage (VIN) and the output voltage (VOUT) (that is, the duty cycle), and calculate the optimized operating frequencies of all operating points through MATLAB to separately determine what is the final frequency suitable for each operating point and get FIG. 4.

When the user specifies the first frequency through the integrated circuit bus (I2C) 34, the system will determine whether the first frequency specified by the user meets the frequency reducing condition. Once the above determination result is YES, the system will automatically reduce frequency to increasing efficiency. According to FIG. 4, it can be known what operating frequency is the most efficient at each operating point, so it can be known which frequency band the frequency should be reduced to through FIG. 4.

In detail, the system will select corresponding reference voltage VREF according to the first frequency specified by the user and generates the on-time signal TON through the comparator. Then, the system will compare the duty cycle of the current pulse width modulation signal PWM with the width of the on-time signal TON. If the width of the duty cycle of the pulse width modulation signal PWM is smaller than the width of the on-time signal TON, the frequency reducing condition is met, and the frequency reducing operation starts.

At each frequency reducing operation, the width of the on-time signal TON regenerated by the system according to the reduced frequency will be slightly reduced, and the reducing speed can be set according to FIG. 4. The system will continue the frequency reducing operation until the width of the duty cycle of the pulse width modulation signal is larger than the width of the on-time signal TON. At this time, the final frequency value is the frequency value that can provide the highest efficiency as shown in FIG. 4, so that the goal of efficiency optimization can be achieved.

Figure 5:
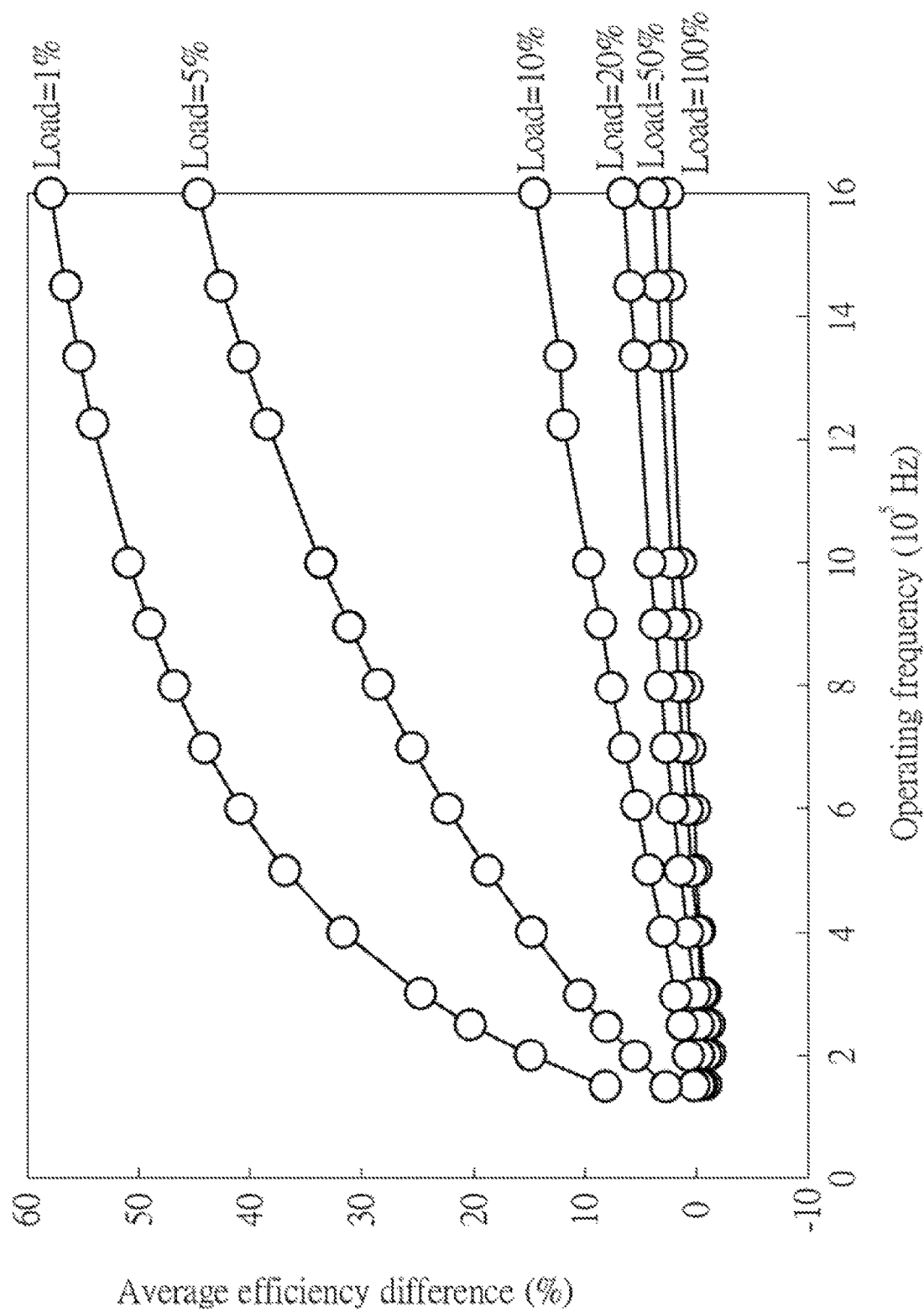
FIG. 5 is a schematic diagram showing the relationship between the operating frequencies and the average efficiency differences.

Please refer to FIG. 5. FIG. 5 is a schematic diagram showing the relationship between the operating frequency and the average efficiency difference. The average efficiency difference is the efficiency with automatic frequency modulation minus the efficiency without automatic frequency modulation. If 16 PWM operating bands from 100 KHz to 1600 KHz are taken as an example, the efficiency improvement results with automatic frequency modulation can be obtained through MATLAB calculation. It can be seen from the six curves from light-load to heavy-load (for example, from 1% loading to 100% loading) in FIG. 5 that too high frequency is unnecessary at light-load; therefore, the efficiency can be improved most at light-load with high-frequency.

Another embodiment of the invention is an automatic frequency modulation method applied to a PWM system. In this embodiment, the automatic frequency modulation method can be applied to a display driving circuit (for example, a LED driver) and can use efficiency statistics as a reference for frequency modulation, but not limited to this.

Figure 6:
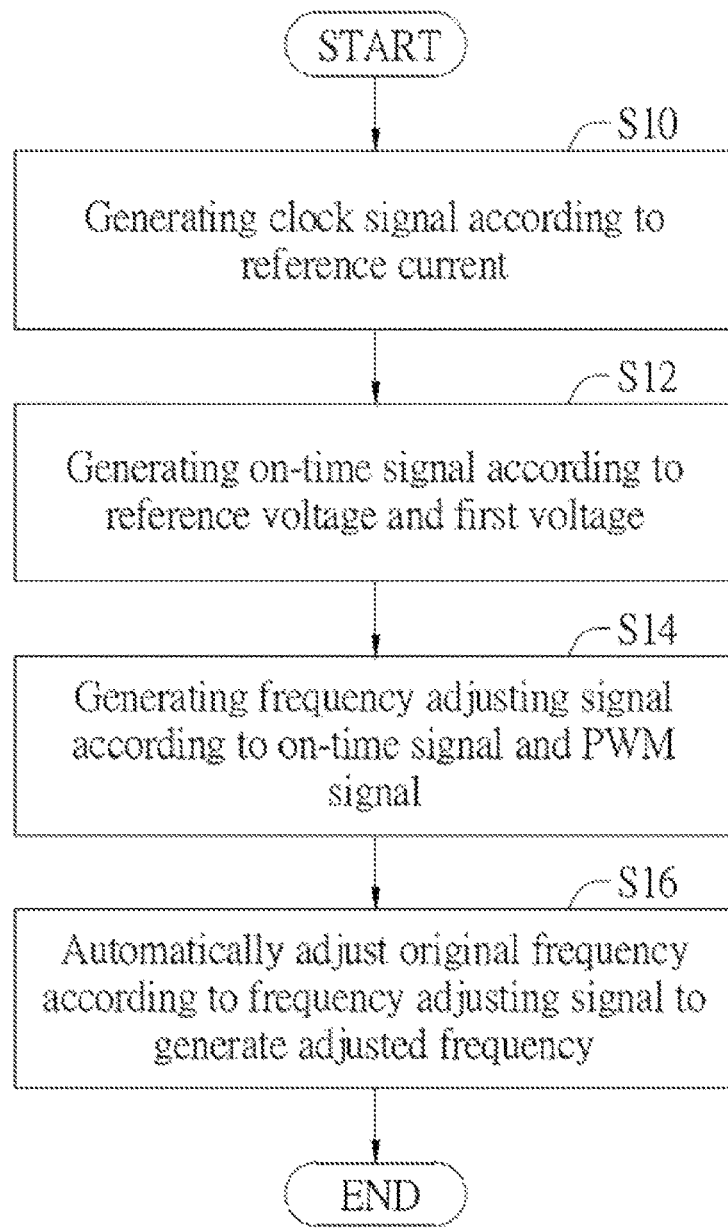
FIG. 6 illustrates a flowchart of an automatic frequency modulation method in another embodiment of the invention.

Please refer to FIG. 6. FIG. 6 shows a flowchart of the automatic frequency modulation method in this embodiment. As shown in FIG. 6, the automatic frequency modulation method can include the following steps:

Step S10: generating a clock signal according to a reference current;

Step S12: generating an on-time signal according to a reference voltage and a first voltage, wherein the first voltage is related to an oscillator unit;

Step S14: generating a frequency adjusting signal according to the on-time signal and the PWM signal; and Step S16: automatically adjust an original frequency according to the frequency adjusting signal to generate an adjusted frequency.

In practical applications, the reference current and the reference voltage can be generated according to the adjusted frequency, but not limited to this. Step S12 can include two sub-steps: generating a second voltage according to the first voltage; and generating the on-time signal according to the second voltage and the reference voltage, but not limited to this.

The first voltage in Step S12 can be a node voltage between an oscillating current source and an oscillating capacitor coupled in series in the oscillator unit, but not limited to this. Step S14 can generate a frequency adjusting signal according to phase detecting results of the on-time signal and the PWM signal, but not limited to this. The original frequency in Step S16 can be provided by an integrated circuit bus (I2C), but not limited to this.

Next, the detailed process steps of the automatic frequency modulation method of the invention will be described through a practical application scenario.

Figure 7:
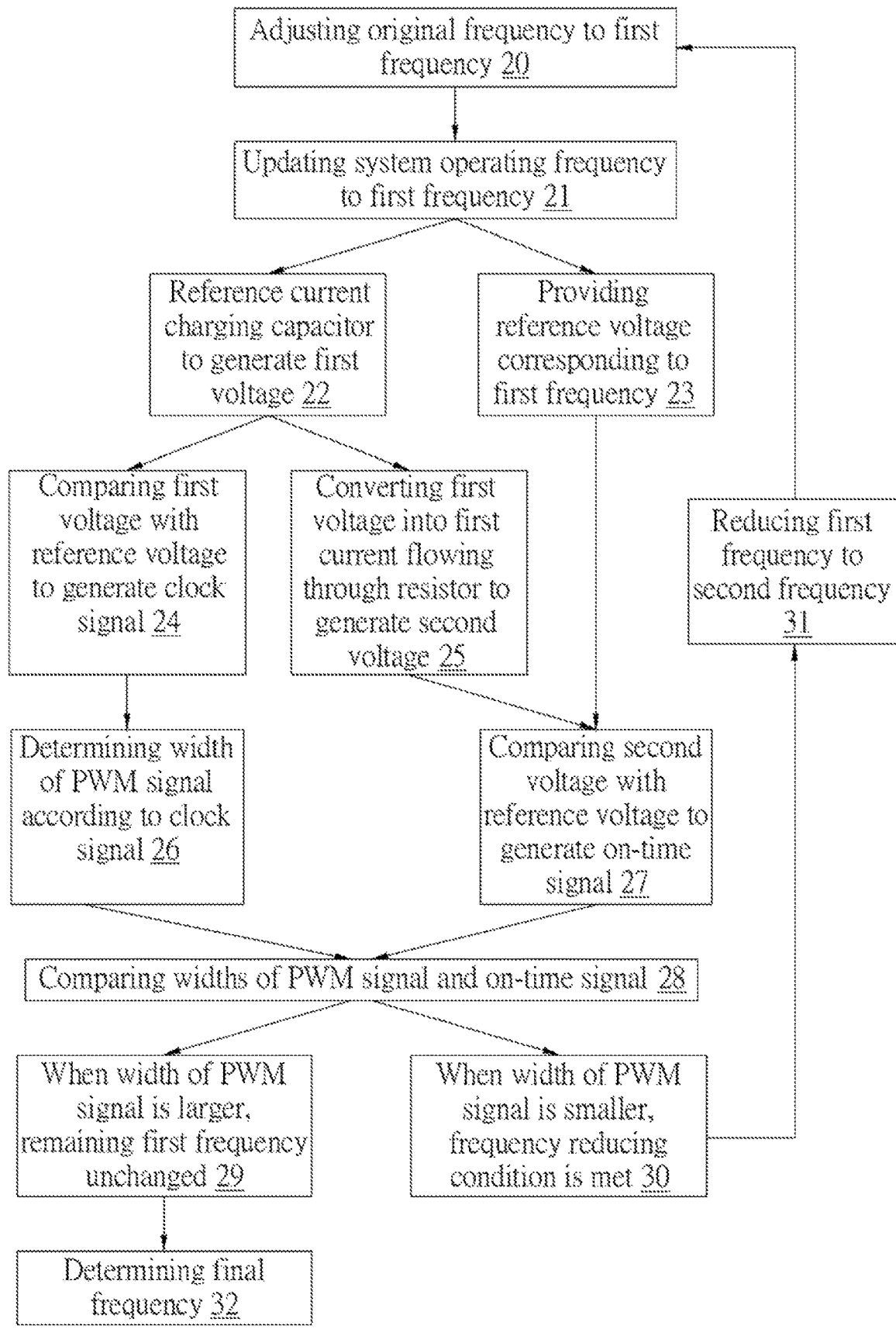
FIG. 7 is a flowchart of an automatic frequency modulation method in another embodiment of the invention.

As shown in FIG. 7, the automatic frequency modulation method can include the following steps:

Step S20: providing the original frequency and adjusting it to the first frequency;

Step S21: updating the system operating frequency to the first frequency;

Step S22: providing a corresponding reference current according to the first frequency to charge the oscillating capacitor to generate the first voltage;

Step S23: providing a corresponding reference voltage according to the first frequency;

Step S24: comparing the first voltage with the reference voltage to generate a clock signal;

Step S25: converting the first voltage into the first current and the first current flowing through the resistor to generate the second voltage;

Step S26: determining the width of the PWM signal according to the clock signal;

Step S27: comparing the second voltage with the reference voltage to generate the on-time signal;

Step S28: comparing the widths of the PWM signal and the on-time signal by phase detecting;

Step S29: if the comparison result of Step S28 is that the width of the PWM signal is larger than the width of the on-time signal, the frequency reducing condition is not met, so the first frequency remains unchanged;

Step S30: if the comparison result of Step S28 is that the width of the PWM signal is smaller than the width of the on-time signal, the frequency reducing condition is met, so Step S31 is executed to reduce the first frequency to the second frequency and return to Step S21 to update the operating frequency to the second frequency; and Step S32: determining the final frequency.

Compared to the prior arts, the invention discloses an automatic frequency modulation circuit and an automatic frequency modulation method applied to a PWM system using efficiency statistics as a reference for frequency modulation without switching between the PWM mode and the PFM mode according to the load status (heavy-load or light-load), but directly determine the new operating frequency of each operating point according to its efficiency statistical results, so it can effectively avoid the misjudgment due to some special circumstances (such as when the dimming frequency of the LED driver is too low) when determining whether the operating mode should be switched to achieve the effect of optimizing efficiency.

With the example and explanations above, the features and spirits of the invention will be hopefully well described. Those skilled in the art will readily observe that numerous modifications and alterations of the device may be made while retaining the teaching of the invention. Accordingly, the above disclosure should be construed as limited only by the metes and bounds of the appended claims.

What is claimed is:

1. An automatic frequency modulation circuit, applied to a PWM system and using efficiency statistics as a reference for frequency modulation, comprising:
   an oscillator unit, configured to receive a reference current and generate a clock signal;
   an on-time generating unit, coupled to the oscillator unit and configured to receive a reference voltage and a first voltage of the oscillator unit and generate an on-time signal;
   a frequency adjusting unit, coupled to the on-time generating unit and configured to receive the on-time signal and a PWM signal and generate a frequency adjusting signal; and
   a frequency selecting unit, coupled to the frequency adjusting unit and configured to automatically adjust an original frequency according to the frequency adjusting signal to generate an adjusted frequency.

2. The automatic frequency modulation circuit of claim 1, further comprising an integrated circuit bus (I2C) coupled to the frequency selecting unit and configured to provide the original frequency to the frequency selecting unit.

3. The automatic frequency modulation circuit of claim 1, further comprising a reference current generating unit coupled between the frequency selecting unit and the oscillator unit and configured to receive the adjusted frequency outputted by the frequency selecting unit and generate the reference current to the oscillator unit.

4. The automatic frequency modulation circuit of claim 1, further comprising a reference voltage generating unit coupled between the frequency selecting unit and the on-time generating unit and configured to receive the adjusted frequency outputted by the frequency selecting unit and generate the reference voltage to the on-time generating unit.

5. The automatic frequency modulation circuit of claim 1, wherein the on-time generating unit generates a second voltage according to the first voltage and then generates the on-time signal according to the second voltage and the reference voltage.

6. The automatic frequency modulation circuit of claim 1, wherein the frequency adjusting unit generates the frequency adjusting signal according to a phase detecting result of the on-time signal and the PWM signal.

7. The automatic frequency modulation circuit of claim 1, wherein the oscillator unit comprises an oscillating current source and an oscillating capacitor coupled in series with each other, and the first voltage is a node voltage between the oscillating current source and the oscillating capacitor.

8. An automatic frequency modulation method, applied to a PWM system and using efficiency statistics as a reference for frequency modulation, comprising steps of:
   (a) generating a clock signal according to a reference current;
   (b) generating an on-time signal according to the reference voltage and a first voltage, wherein the first voltage is related to an oscillator unit;
   (c) generating a frequency adjusting signal according to the on-time signal and a PWM signal; and
   (d) automatically adjust an original frequency according to the frequency adjusting signal to generate an adjusted frequency.

9. The automatic frequency modulation method of claim 8, wherein the original frequency in the step (d) is provided by an integrated circuit bus (I2C).

10. The automatic frequency modulation method of claim 8, wherein the reference current is generated according to the adjusted frequency.

11. The automatic frequency modulation method of claim 8, wherein the reference voltage is generated according to the adjusted frequency.

12. The automatic frequency modulation method of claim 8, wherein the step (b) comprises:
   (b1) generating a second voltage according to the first voltage; and
   (b2) generating the on-time signal according to the second voltage and the reference voltage.

13. The automatic frequency modulation method of claim 8, wherein the step (c) generates the frequency adjusting signal according to a phase detecting result of the on-time signal and the PWM signal.

14. The automatic frequency modulation method of claim 8, wherein the first voltage in the step (b) is a node voltage between an oscillating current source and an oscillating capacitor coupled in series in the oscillator unit.

* * * * *